United States Patent
Yu et al.

(10) Patent No.: US 10,749,526 B1
(45) Date of Patent: Aug. 18, 2020

(54) DRIVER DEVICE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Po-Shing Yu, Hsinchu (TW); Wen-Lung Tu, Hsinchu (TW); Ju-Chieh Wang, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/733,253

(22) Filed: Jan. 3, 2020

(30) Foreign Application Priority Data

Apr. 30, 2019 (TW) .............................. 108115115 A

(51) Int. Cl.
| H03K 17/16 | (2006.01) |
| H03K 19/0175 | (2006.01) |
| H04L 25/02 | (2006.01) |
| H02H 9/04 | (2006.01) |

(52) U.S. Cl.
CPC ..... *H03K 19/017509* (2013.01); *H02H 9/045* (2013.01); *H04L 25/028* (2013.01); *H04L 25/0272* (2013.01)

(58) Field of Classification Search
CPC ............ H02H 9/045; H03K 19/017509; H04L 25/0272; H04L 25/028
See application file for complete search history.

(56) References Cited

U.S. PATENT DOCUMENTS

| 6,396,329 | B1 * | 5/2002 | Zerbe | ........................ G11C 7/02 327/319 |
| 7,093,145 | B2 * | 8/2006 | Werner | ............. H04L 25/03006 713/300 |
| 7,308,044 | B2 * | 12/2007 | Zerbe | .................. H04L 25/4917 327/333 |
| 7,508,236 | B2 | 3/2009 | Lai et al. | |
| 8,549,057 | B1 * | 10/2013 | Hsieh | .................. G06F 15/7871 375/232 |
| 9,231,631 | B1 * | 1/2016 | Ke | ........................ H04B 1/1036 |
| 2013/0195165 | A1 * | 8/2013 | Poulton | ............... H04L 25/0274 375/229 |

(Continued)

*Primary Examiner* — Alexander H Taningco
*Assistant Examiner* — Kurtis R Bahr
(74) *Attorney, Agent, or Firm* — CKC & Partners Co., LLC

(57) ABSTRACT

A driver device includes a T-coil circuit and driver circuitries. The driver circuitries are averagely configured as a first driver set and a second driver set. The driver circuitries of the first driver set amplify one of a first data signal and a second data signal according to first portion of bits of an equalization signal, to generate a first output signal and to transmit the same to a first node of the T-coil circuit. The driver circuitries of the second driver set amplify one of the first data signal and the second data signal according to second portion of bits of the equalization signal, to generate a second output signal and to transmit the same to a second node of the T-coil circuit. The T-coil circuit further combines the first and second output signals as a third data signal, and transmits the third data signal to a channel.

14 Claims, 4 Drawing Sheets

(56) References Cited

U.S. PATENT DOCUMENTS

2015/0214943 A1* 7/2015 Tirunagari ......... H03K 19/0175
327/382
2019/0044564 A1* 2/2019 Zhang .................... H02H 9/045

* cited by examiner

DRIVER DEVICE

RELATED APPLICATIONS

This application claims priority to Taiwan Application Serial Number 108115115, filed Apr. 30, 2019, which is herein incorporated by reference.

BACKGROUND

Technical Field

The disclosure relates to a driver device, particularly to a driver device with signal equalization function.

Description of Related Art

As data transmission speeds increase, signal integrity is one of the factors that need to be considered in current applications. Generally, the channel will attenuate high frequency of the data signals, resulting in reduced signal integrity of the data signals. Before transmitting the data signals, the data signals are usually amplified by a driver to improve their signal integrity. However, the driver and other related circuits (voltage protection circuits, bias circuits, etc.) will derive extra load, cause the bandwidth reduction of the system and cannot support high-speed data applications.

SUMMARY

In order to solve the above problems, one aspect of the present disclosure is a driver device including a T-coil circuit and multiple driver circuitries. The driver circuitries are averagely configured as a first driver set and a second driver set. The driver circuitries of the first driver set are configured to amplify one of a first data signal and a second data signal according to first portion of bits of an equalization signal, to generate a first output signal and to transmit the same to a first node of the T-coil circuit. The driver circuitries of the second driver set are configured to amplify one of the first data signal and the second data signal according to second portion of bits of the equalization signal, to generate a second output signal and to transmit the same to a second node of the T-coil circuit. The T-coil circuit is further configured to combine the first and second output signals as a third data signal, and transmits the third data signal to a channel.

In some embodiments, each of the driver circuitries includes a multiplexer circuit and a driver circuit. The multiplexer circuit is configured to select one of the first data signal and the second data signal according to a corresponding bit of the equalization signal, so as to output as a third output signal. The driver circuit is configured to amplify the third output signal, and to output a corresponding one of the first output signal or the second output signal.

In summary, the driver device provided in some embodiments of the present disclosure is able to improve the transmission bandwidth by using the T-coil circuit, and to achieve higher signal integrity by averagely setting multiple sets of driver circuitries.

DETAILED DESCRIPTION

The terms used in this specification and claims, unless otherwise stated, generally have their ordinary meanings in the art, within the context of the disclosure, and in the specific context where each term is used. Certain terms that are used to describe the disclosure are discussed below, or elsewhere in the specification, to provide additional guidance to the practitioner skilled in the art regarding the description of the disclosure.

It will be understood that, although the terms "first," "second" and "third" etc., may be used herein to describe various elements, these elements should not be limited by these terms. These terms are used to distinguish one element from another. For example, a first element could be termed a second element, and, similarly, a second element could be termed a first element, without departing from the scope of the embodiments.

In this document, the term "coupled" may also be termed "electrically coupled," and the term "connected" may be termed "electrically connected." "Coupled" and "connected" may also be used to indicate that two or more elements cooperate or interact with each other.

In the present disclosure, the term "circuitry" generally refers to a single system that includes one or more circuits. The term "circuit" generally refers to an object that is connected in a manner by one or more transistors and/or one or more active and passive components to process signals.

Figure 1:
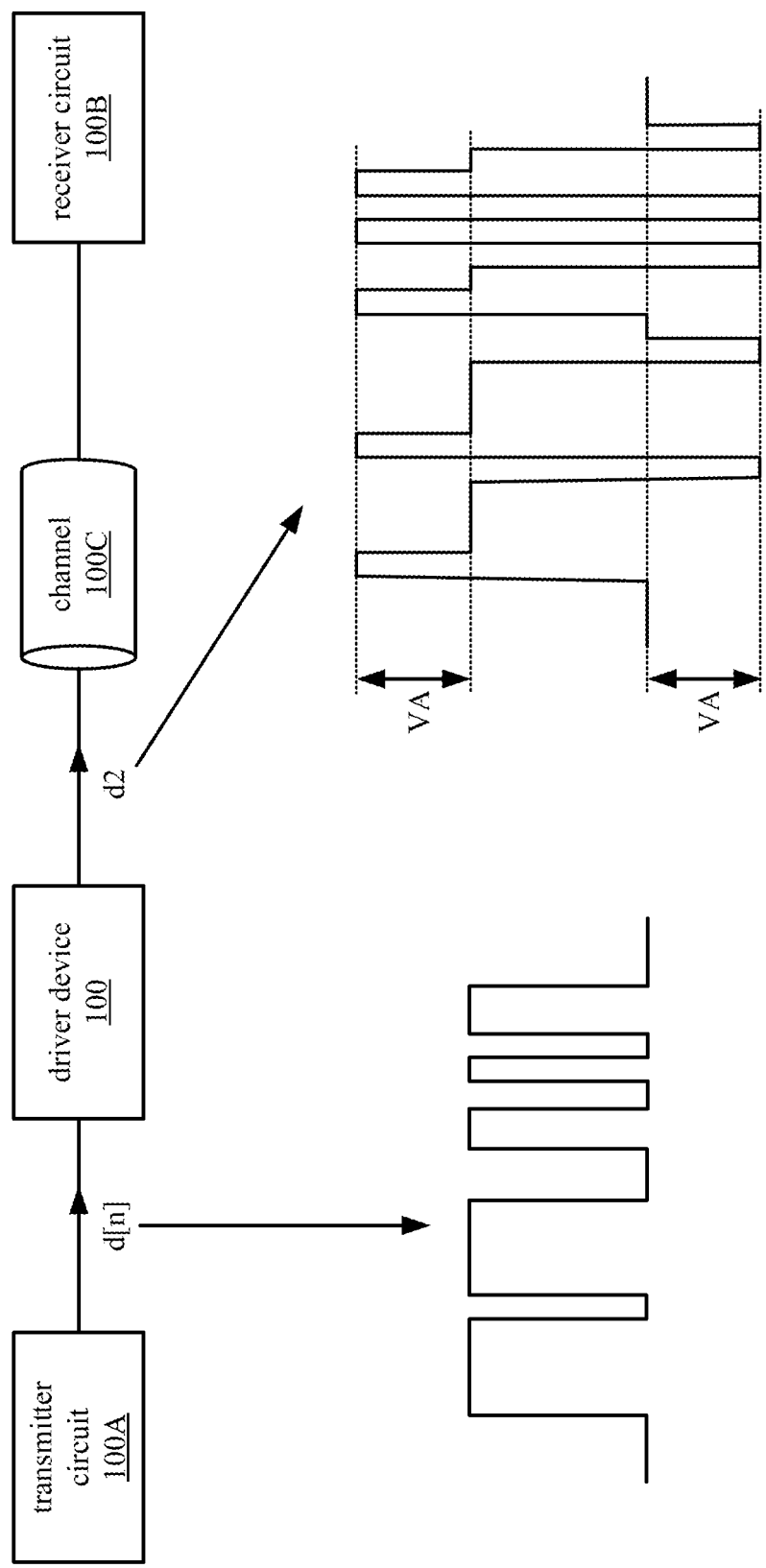
FIG. 1 is a schematic diagram illustrating application of a driver device in accordance with some embodiments of the disclosure.

Please refer to FIG. 1. FIG. 1 is a schematic diagram illustrating application of a driver device 100 in accordance with some embodiments of the disclosure. In some embodiments, the driver device 100 may be applied to data transmission. For example, the driver device 100 may be coupled between a transmitter circuit 100A and a receiver circuit 100B, and the driver device 100 is coupled to the receiver circuit 100B through a channel 100C. In some embodiments, the driver device 100 may be configured to increase the transmission bandwidth and to provide signal equalization function, so as to improve the attenuation caused by the channel 100C.

In some embodiments, the aforementioned signal equalization function may be pre-emphasis. In some embodiments, the aforementioned signal equalization function may be de-emphasis. The transmitter circuit 100A outputs a data signal d[n] to the driver device 100. The driver device 100 may perform the equalization according to the data signal d[n], so as to output a data signal d2 to the receiver circuit 100B. Take the pre-emphasis as an example, the channel 100C will cause some attenuation to the high frequency components of the data signal d[n], in which the high frequency components of the data signal d[n] usually are a falling edge of changing from a logical value of 1 to a logical value of 0, or a rising edge of changing from the logical value of 0 to the logical value of 1. Therefore, the driver device 100 may increase signal levels (e.g., an adjustment level VA) of the falling/rising edge of the data signal d[n], so as to compensate the attenuation caused by the channel 100C.

Figure 2:
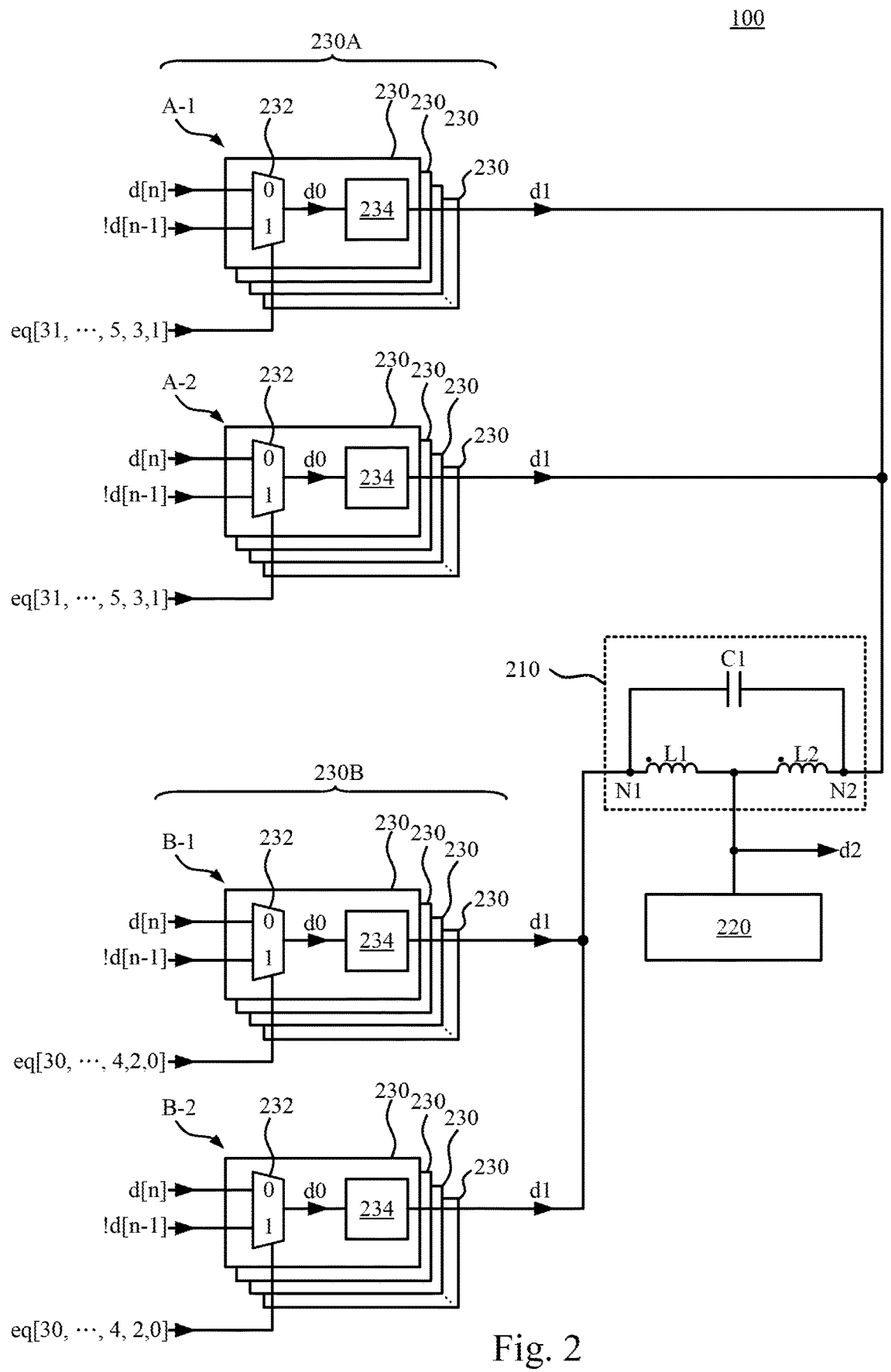
FIG. 2 is a schematic diagram illustrating circuit of a driver device in accordance with some embodiments of the disclosure.

Please refer to FIG. 2. FIG. 2 is a schematic diagram illustrating circuit of a driver device 100 in accordance with some embodiments of the disclosure. For ease to understanding, similar elements in FIGS. 1~2 will be designated by the same reference numerals.

The driver device 100 includes a T-coil circuit 210, an electrostatic discharge (ESD) protection circuit 220 and multiple driver circuitries 230. The T-coil circuit 210 receives output signals d1 transmitted by the driver circuitries 230, and combines the multiple output signal d1 into the data signal d2. The T-coil circuit 210 outputs the data signal d2 to the aforementioned channel 100C.

The T-coil circuit 210 includes an inductance L1, an inductance L2 and a capacitor C1. A first terminal of the inductance L1 is coupled to a part of the driver circuitries 230 and a first terminal of the capacitor C1 (labeled as node N1). A second terminal of the inductance L1 is coupled to the ESD protection circuit 220, a first terminal of the inductance L2 and the channel 100C in FIG. 1, so as to output the data signal d2. A second terminal of the inductance L2 is coupled to a second terminal of the capacitor C1 (labeled as node N2) and the other part of the driver circuitries 230.

Using the mutual inductance characteristics of the inductances L1~L2 and the element characteristics of the inductances L1~L2 and the capacitor C1, the T-coil circuit 210 is able to reduce the influence of the load of the ESD protection circuit 220, so as to increase the transmission bandwidth of the system. For example, when the data signal d[n] is low frequency, the inductances L1~L2 are equivalent to short circuits and are directly coupled to the channel 100C. When the data signal d[n] is high frequency, the capacitor C1 is equivalent to a short circuit. In other words, the equivalent input impedances of the two input terminals (i.e., node N1 and node N2) of the T-coil circuit 210 are approximately the same. As such, the load of the ESD protection circuit 220 and/or the load of other circuits can be ignored, and the T-coil circuit 210 can provide more matching transmission impedance (e.g., the aforementioned terminal resistor) to the driver circuitries 230, so as to improve the signal integrity of the data signal d2.

The ESD protection circuit 220 is configured to provide ESD protection to the receiver circuit 100B and/or the channel 100C, so as to prevent the aforementioned components from being damaged by static electricity during data transmission. In some embodiments, the ESD protection circuit 200 can be implemented by a diode string (not shown) serially connected between two power supply rails, but the present disclosure is not limited thereto. Various types of ESD protection circuits 220 are within the scope of present disclosure.

Each driver circuitry 230 includes a multiplexer circuit 232 and a driver circuit 234. Each of the multiplexer circuits 232 is coupled to a transmit circuit 110 to receive the data signal d[n]. Each of the multiplexer circuits 232 selects one of the data signal d[n] and a data signal !d[n−1] according to a corresponding bit in an equalization signal eq[31:0], and outputs it as an output signal d0 to the driver circuit 234. The driver circuit 234 is configured to amplify the output signal d0 so as to generate the output signal d1 to the T-coil circuit 210. For example, in a driver set 230A to be described later, the first multiplexer circuit 232 performs the aforementioned operations based on the 31st bit of the equalization signal eq, and the second multiplexer circuit 232 performs the aforementioned operations based on the 29th bit of the equalization signal eq. As the foregoing descriptions, the correspondence between the multiple multiplexer circuits 232 and the multiple bits of the equalization signal eq can be understood.

In some embodiments, the data signal !d[n−1] is a reverse signal corresponding to the previous data signal of the data signal d[n]. For example, if the previous data signal of the data signal d[n] is the logic value of 1, the data signal !d[n−1] is the logic value of 0. In some embodiments, the driver device 100 may further includes a signal processing circuit (not shown) including a delay circuit and an inverter circuit, so as to generate the data signal !d[n−1] according to the data signal d[n]. In some embodiments, the equalization signal eq[31:0] is configured to set the adjustment level (e.g., the adjustment level VA shown in FIG. 1) of the signal equalization function, but the present disclosure is not limited thereto. For example, the more bits in the equalization signal eq[31:0] that is set to the logic value 1, the more number of the multiplexer circuits 232 that output the data signals !d[n−1] as the output signals d0, and larger the adjustment level VA; on the contrary, the more bits in the equalization signal eq[31:0] that is set to the logic value 0, the smaller the adjustment level VA.

In this embodiment, the multiple driver circuitries 230 are averagely set to the driver set 230A and a driver set 230B The driver set 230A is coupled to the first input terminal (i.e., node N1) of the T-coil circuit 210, and the driver set 230B is coupled to the second input terminal (i.e., node N2) of the T-coil circuit 210.

In the driver set 230A, the multiple driver circuitries 230 are set to generate the output signal d0 according to a half of bits in the equalization signal eq[31:0]. For example, in the driver set 230A, the multiple multiplexer circuits 232 select one of the data signal d[n] and the data signal !d[n−1] as the output signal d0 according to multiple odd bits (i.e., the 31st bit, . . . , the 5th bit, the 3rd bit and the 1st bit) of the equalization signal eq respectively.

Similarly, in the driver set 230B, the multiple driver circuitries 230 are set to generate the output signal d0 according to the other half of bits in the equalization signal eq[31:0]. For example, in the driver set 230B, the multiple multiplexer circuits 232 select one of the data signal d[n] and the data signal !d[n−1] as the output signal d0 according to multiple even bits (i.e., the 30th bit, . . . , the 4th bit, the 2nd bit and the 0th bit) of the equalization signal eq respectively.

In some embodiments, the multiple driver circuitries 230 in the driver set 230A are averagely set to a subgroup A-1 and a subgroup A-2. In some embodiments, the type of the driver circuits 234 corresponding to the subgroup A-1 is set to different from the type of the driver circuits 234 corresponding to the subgroup A-2. For example, the driver circuits 234 corresponding to the subgroup A-1 may be implemented by a voltage mode driver circuit shown in FIG. 4, which will be described later, and the driver circuits 234 corresponding to the subgroup A-2 may be implemented by a current mode driver circuit shown in FIG. 5, which will be described later. Relative to the current mode driver circuit, the voltage mode driver circuit has lower power consumption, and it is easier to set multiple-stage coarse adjustment to the aforementioned adjustment level VA. In addition, the current mode driver circuit has higher gain, and it is easier to set multiple-stage fine adjustment to the aforementioned adjustment level VA. Therefore, by mixing the two modes of the driver circuits 234, better controlled signal equalization can be obtained, and the data signal d2 is able to have good signal integrity.

Similarly, in some embodiments, the multiple driver circuitries 230 in the driver set 230B are averagely set to a subgroup B-1 and a subgroup B-2. In some embodiments, the type of the driver circuits 234 corresponding to the subgroup B-1 is set to different from the type of the driver circuits 234 corresponding to the subgroup B-2. For example, the driver circuits 234 corresponding to the subgroup B-1 may be implemented by the voltage mode driver circuit shown in FIG. 4, which will be described later, and the driver circuits 234 corresponding to the subgroup B-2 may be implemented by the current mode driver circuit shown in FIG. 5, which will be described later.

Or, in other embodiments, the type of the driver circuits 234 corresponding to the subgroup A-1 may be set to be the same as the type of the driver circuits 234 corresponding to the subgroup A-2, and the type of the driver circuits 234 corresponding to the subgroup B-1 may be set to be the same as the type of the driver circuits 234 corresponding to the subgroup B-2. Various setting methods of the driver circuits 234 are within the scopes of the present disclosure.

Figure 3:
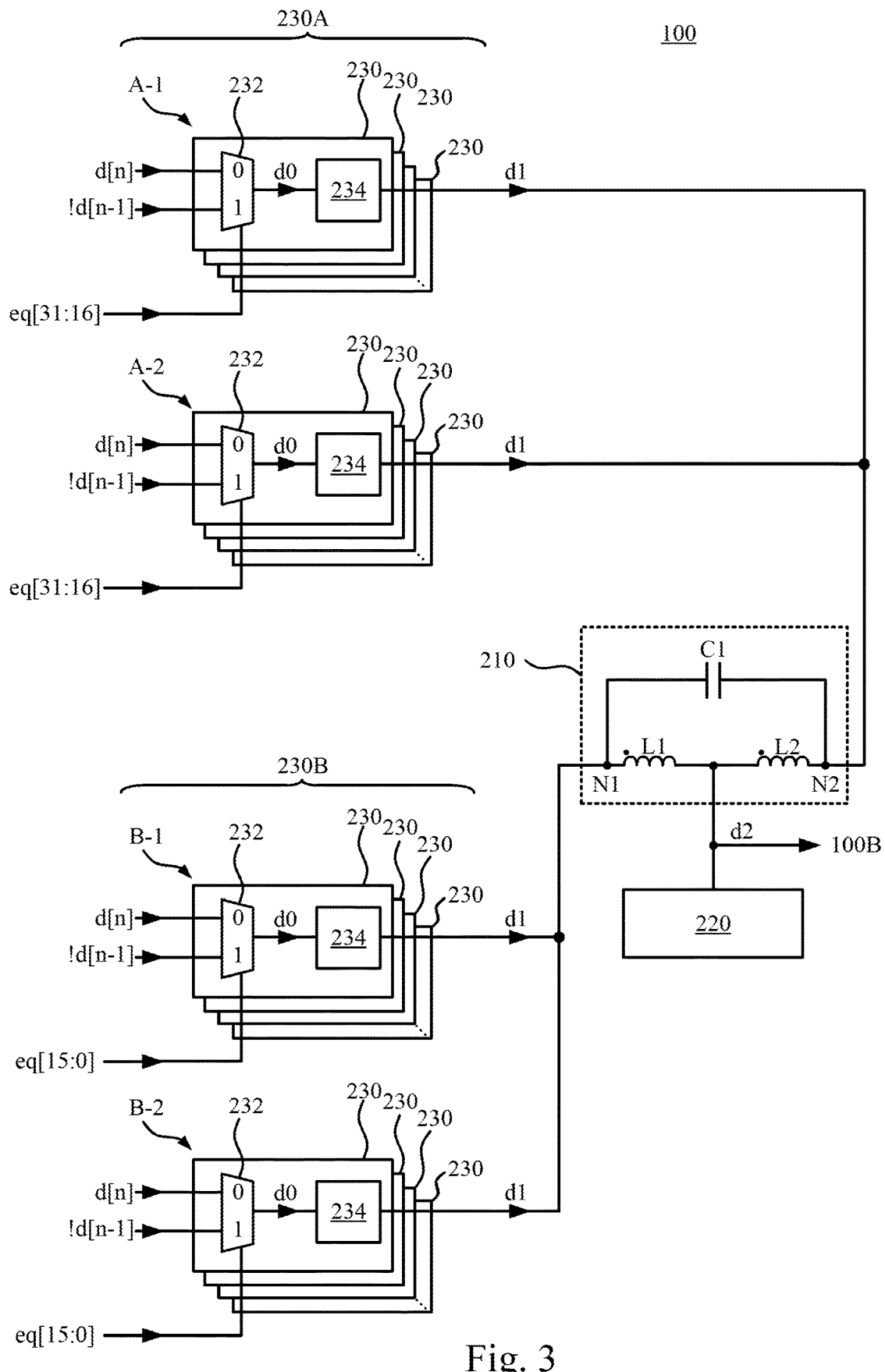
FIG. 3 is a schematic diagram illustrating circuit of a driver device in accordance with some embodiments of the disclosure.

Please refer to FIG. 3. FIG. 3 is a schematic diagram illustrating circuit of a driver device 100 in accordance with some embodiments of the disclosure. For ease to understanding, similar elements in FIGS. 1-3 will be designated by the same reference numerals.

Compared to FIG. 2, in this embodiment, in the driver set 230A, the multiple driver circuitries 230 are set to generate the output signal d0 according to Most Significant Bit (MSB) in the equalization signal eq[31:0]. For example, in the driver set 230A, multiple multiplexer circuits 232 select one of the data signal d[n] and the data signal !d[n−1] as the output signal d0 according to the 31th to 16th bits (labeled as eq[31:16]) of the equalization signal eq respectively. Similarly, in the driver set 230B, the multiple driver circuitries 230 are set to generate the output signal d0 according to Least Significant Bit (LSB) in the equalization signal eq[31:0]. For example, in the driver set 230B, multiple multiplexer circuits 232 select one of the data signal d[n] and the data signal !d[n−1] as the output signal d0 according to the 15th to 0th bits (labeled as eq[15:0]) of the equalization signal eq respectively.

The remaining circuit settings and/or operations are similar to the embodiment of FIG. 2 described above, and thus the details are not repeated herein.

In some embodiments, the equalization signal eq may be coded as thermometer code. In some embodiments, the equalization signal eq may be coded as binary code. By different coding methods of the equalization signal eq, the circuit setting methods described above may be adjusted correspondingly. Therefore, various coding methods of the equalization signal eq are within the scope of the present disclosure. In addition, in each of the embodiments described above, the equalization signal eq with 32 bits is taken as an example, but the present disclosure is not limited thereto.

In some embodiments, the data signal !d[n−1] may be various signals relative to the data signal d[n]. For example, when applied to PCI-E, the data signal !d[n−1] may be a reverse signal (e.g., !d[n−2], !d[n−3] . . . (not shown)) of the previous data signal of the data signal d[n] and/or a reverse signal (e.g., !d[n+1], !d[n+2] . . . (not shown)) of the next data signal of the data signal d[n]. The aforementioned setting methods of the data signal !d[n−1] are used as examples, and various setting methods of the data signal !d[n−1] are within the scope of the present disclosure.

Figure 4:
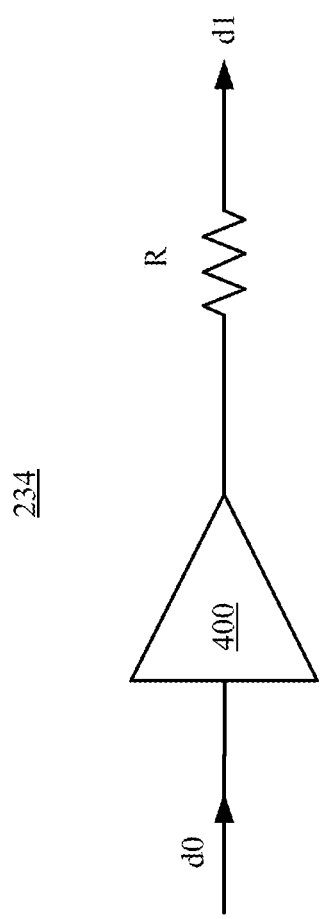
FIG. 4 is a schematic diagram illustrating circuit of a driver device in accordance with some embodiments of the disclosure.

Please refer to FIG. 4. FIG. 4 is a schematic diagram illustrating circuit of a driver device 234 in accordance with some embodiments of the disclosure. For ease to understanding, the similar elements in FIGS. 1-4 will be designated by the same reference numerals.

In this embodiment, the driver circuit 234 is set to the voltage mode driver circuit. The driver circuit 234 includes a voltage mode driver circuit 400 and a resistor R. The voltage mode driver circuit 400 is coupled to the multiplexer circuit 232 in FIG. 2 or 3, in order to receive the output signal d0. The voltage mode driver circuit 400 amplifies the output signal d0, and transmits the amplified output signal d0 to the resistor R. The resistor R converts the amplified output signal d0 into the output signal d1 in a voltage form to the T-coil circuit 210 (i.e., node N1 or node N2).

In some embodiments, the voltage mode driver circuit 400 may be implemented by an input stage circuit (not shown), an output stage circuit (not shown), and an impedance control circuit (not shown). The input stage circuit and the output stage circuit generate a corresponding voltage swing (i.e., amplified output signal d0) according to the output signal d0, and the impedance control circuit is configured to set the resistance value (equivalent to the aforementioned terminal resistor) of the output stage circuit. The above is merely for the example, and the various setting manners of the voltage mode driver circuit 400 are all within the scope of the present disclosure.

Figure 5:
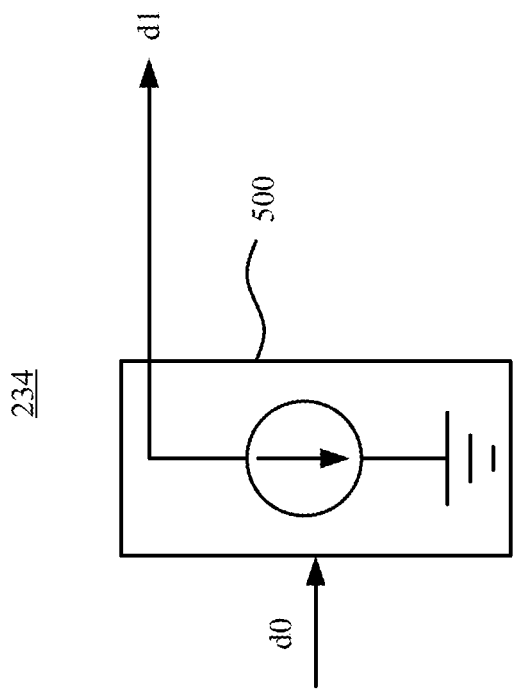
FIG. 5 is a schematic diagram illustrating circuit of a driver device in accordance with some embodiments of the disclosure.

Please refer to FIG. 5. FIG. 5 is a schematic diagram illustrating circuit of a driver device 234 in accordance with some embodiments of the disclosure. For ease to understanding, the similar elements in FIGS. 1~5 will be designated by the same reference numerals.

In this embodiment, the driver circuit 234 is set to the current mode driver circuit. The driver circuit 234 includes a current mode driver circuit 500. The current mode driver circuit 500 is coupled to the multiplexer circuit 232 in FIG. 2 or 3, in order to receive the output signal d0. The current mode driver circuit 500 amplifies the output signal d0, so as to generate the output signal d1 in the current form to the T-coil circuit 210 (i.e., node N1 or node N2).

In some embodiments, the current mode driver circuit 500 may be implemented by an input pair circuit (not shown), a current source circuit (not shown), and the aforementioned terminal resistor, in which the input pair circuit is configured to guide the current provided by the current source circuit according to the output signal d0, so as to generate the output signal d1. The above is merely for the example, and the various setting manners of the current mode driver circuit 500 are all within the scope of the present disclosure.

In summary, the driver device provided in some embodiments of the present disclosure is able to improve the transmission bandwidth by using the T-coil circuit, and to achieve higher signal integrity by averagely setting multiple sets of driver circuitries.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A driver device, comprising:
   a T-coil circuit; and
   a plurality of driver circuitries, averagely configured as a first driver set and a second driver set,
   wherein the driver circuitries of the first driver set are configured to amplify one of a first data signal and a second data signal according to a first portion of bits of an equalization signal, so as to generate a first output signal to a first node of the T-coil circuit, the driver circuitries of the second driver set are configured to amplify one of the first data signal and the second data signal according to a second portion of bits of the equalization signal, so as to generate a second output signal to a second node of the T-coil circuit, the T-coil circuit is further configured to combine the first output signal and the second output signal as a third data signal, and transmits the third data signal to a channel, and wherein the T-coil circuit further comprises:

a capacitor, coupled between the first node and the second node;

a first inductance, coupled to the first node; and a second inductance, coupled between the second node and the first inductance.

2. The driver device of claim 1, wherein the first portion of bits is a plurality of odd bits of the equalization signal, and the second portion of bits is a plurality of even bits of the equalization signal.

3. The driver device of claim 1, wherein the first portion of bits is a half of bits of the equalization signal, and the second portion of bits is the other half of bits of the equalization signal.

4. The driver device of claim 1, wherein the first portion of bits is a plurality of Most Significant Bit (MSB) of the equalization signal, and the second portion of bits is a plurality of Least Significant Bit (LSB) of the equalization signal.

5. The driver device of claim 1, wherein each of the driver circuitries comprises:

a multiplexer circuit, configured to select one of the first data signal and the second data signal according to a corresponding bit of the equalization signal, so as to output as a third output signal; and a driver circuit, configured to amplify the third output signal, and to output a corresponding one of the first output signal or the second output signal.

6. The driver device of claim 5, wherein the first portion of bits is a plurality of odd bits of the equalization signal, and the second portion of bits is a plurality of even bits of the equalization signal.

7. The driver device of claim 5, wherein the first portion of bits is a half of bits of the equalization signal, and the second portion of bits is the other half of bits of the equalization signal.

8. The driver device of claim 5, wherein the first portion of bits is a plurality of Most Significant Bit (MSB) of the equalization signal, and the second portion of bits is a plurality of Least Significant Bit (LSB) of the equalization signal.

9. The driver device of claim 5, wherein in the first driver set or the second driver set, the driver circuitries are divided into a first subgroup and a second subgroup, wherein in the first subgroup, the driver circuit of each of the driver circuitries is a voltage mode driver circuit, and in the second subgroup, the driver circuit of each of the driver circuitries is a current mode driver circuit.

10. The driver device of claim 5, wherein the driver circuit of each of the driver circuitries is a voltage mode driver circuit or a current mode driver circuit.

11. The driver device of claim 1, wherein the second data signal is a reverse signal of a previous data signal of the first data signal.

12. The driver device of claim 1, wherein the second data signal is a reverse signal of a previous data signal of the first data signal or a reverse signal of a next data signal of the first data signal.

13. The driver device of claim 1, wherein the equalization signal is configured to set an adjustment level of a signal equalization function.

14. The driver device of claim 1, further comprising:

an electrostatic discharge protection circuit, coupled to the T-coil circuit and the channel.

\* \* \* \* \*